(12) United States Patent
Qiao et al.

(10) Patent No.: US 9,651,838 B2
(45) Date of Patent: May 16, 2017

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Yun Qiao, Beijing (CN); Jian Sun, Beijing (CN); Cheng Li, Beijing (CN); Seongjun An, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/906,350

(22) PCT Filed: Jul. 16, 2015

(86) PCT No.: PCT/CN2015/084210
§ 371 (c)(1),
(2) Date: Jan. 20, 2016

(87) PCT Pub. No.: WO2016/107140
PCT Pub. Date: Jul. 7, 2016

(65) Prior Publication Data
US 2016/0327842 A1    Nov. 10, 2016

(30) Foreign Application Priority Data

Jan. 4, 2015   (CN) .......................... 2015 1 0002273

(51) Int. Cl.
*H01L 29/04* (2006.01)
*G02F 1/1362* (2006.01)
(Continued)

(52) U.S. Cl.
CPC ...... *G02F 1/136204* (2013.01); *G02F 1/1362* (2013.01); *G02F 1/136209* (2013.01);
(Continued)

(58) Field of Classification Search
CPC ........................... H01L 27/1214; H01L 27/12
(Continued)

(56) References Cited

U.S. PATENT DOCUMENTS 5,936,687 A    8/1999   Lee
2005/0190168 A1   9/2005   Jiang et al.
(Continued)

FOREIGN PATENT DOCUMENTS

CN    1725500 A    1/2006
CN    101192381 A    6/2008
(Continued)

OTHER PUBLICATIONS

PCT/ISA/210 issued in corresponding international application No. PCT/CN2015/084210 dated Oct. 10, 2015.
(Continued)

*Primary Examiner* — Jami M Valentine
(74) *Attorney, Agent, or Firm* — Nath, Goldberg & Meyer; Joshua B. Goldberg; Christopher Thomas

(57) ABSTRACT

The invention provides an array substrate and a manufacturing method thereof, a display panel and a display device, the array substrate includes a base substrate, and a data line, a switching device and a voltage compensation module arranged on the base substrate, the switching device is connected between the data line and the voltage compensation module so that the data line is electrically connected to the voltage compensation module when a voltage on the data line is lower than a preset low voltage or higher than a preset high voltage. The array substrate uses a PN junction as the switching device between the data line and the voltage compensation module, and due to a low leakage current between a P terminal and an N terminal of the PN junction, the power consumption of the array substrate can be reduced.

18 Claims, 3 Drawing Sheets

(51) Int. Cl.
  *G09G 3/36* (2006.01)
  *H01L 27/02* (2006.01)
  *H01L 27/12* (2006.01)
(52) U.S. Cl.
  CPC ..... *G02F 1/136286* (2013.01); *G09G 3/3659* (2013.01); *H01L 27/0255* (2013.01); *H01L 27/124* (2013.01); *H01L 27/127* (2013.01); *G09G 3/3648* (2013.01); *G09G 2300/043* (2013.01); *G09G 2330/023* (2013.01)
(58) Field of Classification Search
  USPC .......................................... 257/72; 438/149
  See application file for complete search history.

(56) References Cited

U.S. PATENT DOCUMENTS

| | | | |
|---|---|---|---|
| 2006/0017139 A1* | 1/2006 | Eguchi | G02F 1/136204 257/656 |
| 2008/0079001 A1* | 4/2008 | Umezaki | H01L 27/12 257/59 |
| 2012/0275215 A1* | 11/2012 | Tsukada | H01L 27/1021 365/149 |

FOREIGN PATENT DOCUMENTS

| | | |
|---|---|---|
| CN | 101246290 A | 8/2008 |
| CN | 103106880 A | 5/2013 |
| CN | 104483796 A | 4/2015 |
| CN | 204314579 U | 5/2015 |
| JP | 8-171081 A | 7/1996 |
| JP | 08171081 * | 7/1996 ............. G09F 1/133 |

OTHER PUBLICATIONS

PCT/ISA/220 issued in corresponding international application No. PCT/CN2015/084210 dated Oct. 10, 2015.

PCT/ISA/237 issued in corresponding international application No. PCT/CN2015/084210 dated Oct. 10, 2015.

1st office action issued in corresponding Chinese application No. 201510002273.4 dated Oct. 9, 2016.

* cited by examiner

ARRAY SUBSTRATE AND
MANUFACTURING METHOD THEREOF,
DISPLAY PANEL AND DISPLAY DEVICE

CROSS REFERENCE TO RELATED
APPLICATION

This is a National Phase Application filed under 35 U.S.C. 371 as a national stage of PCT/CN2015/084210, filed Jul. 16, 2015, an application claiming the benefit of Chinese Application No. 201510002273.4, filed Jan. 4, 2015, the content of each of which is hereby incorporated by reference in its entirety.

TECHNICAL FIELD

The invention relates to the field of liquid crystal display technology, and in particular to an array substrate and a manufacturing method thereof, a display panel and a display device.

BACKGROUND

In thin film transistor liquid crystal displays (TFT LCDs), low-temperature polysilicon (LTPS) technology has advantages such as high resolution, fast response, high brightness and high aperture ratio; with the above advantages, LTPS technology has become one of the development directions of TFT LCD. LTPS technology is relatively complex, resulting in a low product yield of the TFT LCDs adopting LTPS technology. In particular, during the production and use procedure of the TFT LCDs using LTPS technology, static electricity is easily generated. Therefore, in order to improve anti-ESD (Electro-static Discharge, hereinafter to be referred as ESD for short) performance, an ESD circuit is generally provided in a TFT LCD adopting LTPS technology, so as to avoid damage of the TFT LCD due to ESD.

FIG. 1 is a schematic view of an ESD circuit in an existing TFT LCD using LTPS technology. As shown in FIG. 1, the ESD circuit includes a first transistor and a second transistor, a gate G and a drain D of the first transistor are connected to a data line DATA, a source S of the first transistor is connected to a high voltage terminal VDD on the array substrate, and the voltage on the high voltage terminal VDD is the highest positive voltage VGH when the display panel of the TFT LCD operates normally; a source S of the second transistor is connected to the data line DATA, a gate G and a drain D of the second transistor is connected to a low voltage terminal VSS, and the voltage on the low voltage terminal VGL is the lowest negative voltage VGL when the display panel of the TFT LCD operates normally. FIG. 2 shows the structure of the TFT LCD in FIG. 1. As shown in FIG. 2, as for both the first transistor and the second transistor, the source S and the drain D are connected by polysilicon provided on the array substrate, two ends of the polysilicon connecting the source S and the drain D are N-type highly doped, and the polysilicon between the two ends are P-type lightly doped.

In the above TFT LCD, since the gate G and the drain D of the first transistor are connected together, and the gate G and the drain D of the second transistor are connected together, the first transistor and the second transistor are equivalent to two one-way electric conductive diodes. When static electricity is generated so that the voltage on the data line DATA is higher than the highest positive voltage VGH, the first transistor is turned on, the data line DATA is connected to the high voltage terminal VDD, and the voltage on the data line DATA is not higher than the highest positive voltage VGH; when static electricity is generated so that the voltage on the data line DATA is lower than the lowest negative voltage VGL, the second transistor is turned on, the data line DATA is connected to the low voltage terminal VSS and the voltage on the data line DATA is not lower than the lowest negative voltage VGL. When the voltage on the data line DATA is between the highest positive voltage VGH and the lowest negative voltage VGL, the first transistor and the second transistor are turned off so that the high voltage terminal VDD and the low voltage terminal VSS will not affect the voltage on the data line DATA.

In the above TFT LCD, the first transistor and the second transistor, of which the gate G and the drain D are connected together, are equivalent to the one-way electric conductive diodes, which are connected between the data line DATA and the high voltage terminal VDD and between the data line DATA and the low voltage terminal VDD, respectively, and the manufacturing process of the array substrate is not complicated (the first transistor and the second transistor are manufactured together with the thin film transistor in each pixel unit). However, since both the two ends of the polysilicon are N-type highly doped, a large leakage current is generated between the sources S and the drains D of the first transistor and the second transistor, which will cause a high power consumption when the TFT LCD operates.

SUMMARY OF THE INVENTION

The invention aims to solve at least one of the technical problems existing in the prior art, and proposes an array substrate and a manufacturing method thereof, a display panel and a display device. The array substrate, the display panel and the display device of the invention have low power consumption.

In order to achieve the object of the invention, an array substrate is provided to include a base substrate, and a data line, a switching device and a voltage compensation module arranged on the base substrate, wherein the switching device is connected between the data line and the voltage compensation module so that the data line is electrically connected to the voltage compensation module when a voltage on the data line is lower than a preset low voltage or higher than a preset high voltage; and wherein the switching device is constituted by at least one PN junction.

Wherein the voltage compensation module includes a high voltage terminal and a low voltage terminal, a voltage on the high voltage terminal is the preset high voltage, and a voltage on the low voltage terminal is the preset low voltage.

Wherein the switching device includes a first PN junction and a second PN junction, a P terminal of the first PN junction is connected to the data line, and an N terminal of the first PN junction is connected to the high voltage terminal; and a P terminal of the second PN junction is connected to the low voltage terminal, and an N terminal of the second PN junction is connected to the data line. When the voltage on the data line is higher than the preset high voltage, the data line is electrically connected to the high voltage terminal by the first PN junction; and when the voltage on the data line is lower than the preset low voltage, the data line is electrically connected to the low voltage terminal via the second PN junction.

Wherein the voltage compensation module includes a high voltage terminal, and a voltage on the high voltage terminal is the preset high voltage; and the switching device is constituted by one PN junction, a P terminal of the PN junction is connected to the data line, and an N terminal of the PN junction is connected to the high voltage terminal. When the voltage on the data line is higher than the preset high voltage, the data line is electrically connected to the high voltage terminal by the PN junction.

Wherein the voltage compensation module includes a low voltage terminal, and a voltage on the low voltage terminal is the preset low voltage; and the switching device is constituted by one PN junction, a P terminal of the PN junction is connected to the low voltage terminal, and an N terminal of the PN junction is connected to the data line. When the voltage on the data line is lower than the preset low voltage, the data line is electrically connected to the low voltage terminal by the PN junction.

Wherein a P terminal and an N terminal of the PN junction are formed by performing P-type highly doping and N-type highly doping on two ends of polysilicon or monocrystalline silicon.

Wherein there is an interval region between the P terminal and the N terminal of the PN junction, and P-type lightly doping is performed on the interval region.

Wherein the array substrate further includes a light blocking layer formed on the base substrate, and the light blocking layer is arranged directly below the PN junction.

Wherein the array substrate includes an effective display region and a border region surrounding the effective display region, and the PN junction and the voltage compensation module are arranged in the broader region.

Wherein each pixel unit of the array substrate is provided with a thin film transistor therein, and the PN junction is formed during the procedure of forming the thin film transistor.

As another technical solution, the invention further provides a manufacturing method of the above array substrate, including steps:

forming the data line on the base substrate; and forming at least one PN junction, which is connected to the data line and the voltage compensation module, on the base substrate.

Wherein the step of forming the at least one PN junction includes:

forming a polysilicon or monocrystalline silicon layer on the base substrate; and performing P-type highly doping and N-type highly doping on two ends of the polysilicon or monocrystalline silicon layer, respectively.

Wherein, the manufacturing method of the array substrate further includes a step of forming a thin film transistor on the base substrate, and the PN junction is formed during the step of forming the thin film transistor.

Wherein, the manufacturing method of the array substrate further includes a step of forming a light blocking layer on the base substrate prior to the step of forming the at least one PN junction.

Wherein, the PN junction is arranged directly above the light blocking layer.

As another technical solution, the invention provides a display panel, including an arrays substrate and an opposite substrate, wherein the array substrate employs the above array substrate provided by the invention.

As another technical solution, the invention provides a display device, including the above display panel provided by the invention.

The invention has the following advantages:

In the array substrate provided by the invention, the PN junction is used as a switching device connected between the data line and the voltage compensation module, and compared to the prior art in which the gate and the drain of the transistor are connected together, the leakage current between the P terminal and the N terminal of the PN junction is lower, and thus the array substrate provided by the invention has lower power consumption.

In the manufacturing method of the array substrate provided by the invention, the PN junction connecting the data line and the voltage compensation module is formed on the base substrate to act as a switching device, so that the leakage current in the switching device is lower, and thus the array substrate manufactured by the manufacturing method of the array substrate provided by the invention has lower power consumption.

The display panel provided by the invention has lower power consumption, since it employs the above array substrate provided by the invention.

The display device provided by the invention has lower power consumption, since it employs the above display panel provided by the invention.

DESCRIPTION OF THE DRAWINGS

Drawings are used to provide further understanding of the invention, constitute a part of the description, and are used to interpret the invention in connection with the following embodiments, but do not limit the invention. In the drawings.

In the drawings.

1. array substrate; 10: base substrate; 11: PN junction; 12: voltage compensation module; 110: first PN junction; 11: second PN junction; and 13: light blocking layer.

DETAILED DESCRIPTION OF EMBODIMENTS

In the following, embodiments of the invention will be described in detail in connection with the drawings. It should be understood that, the specific embodiments described herein are only for explaining and interpreting the invention and are not intended to be used to limit the invention.

Figure 1:
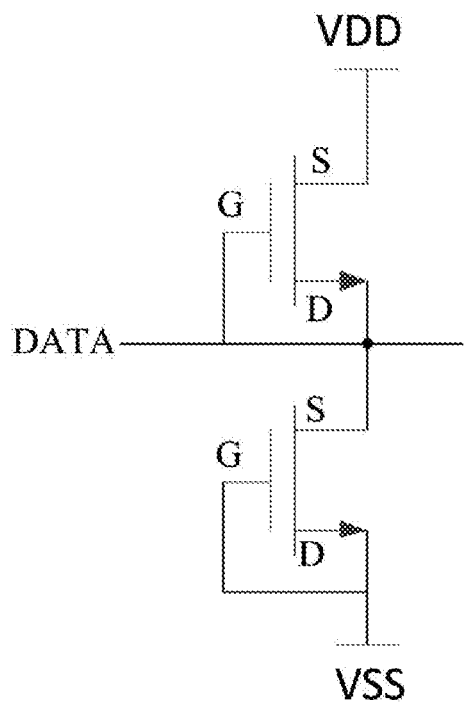
FIG. 1 is a schematic view of an ESD circuit in an existing TFT LCE adopting LTPS technology.
Figure 2:
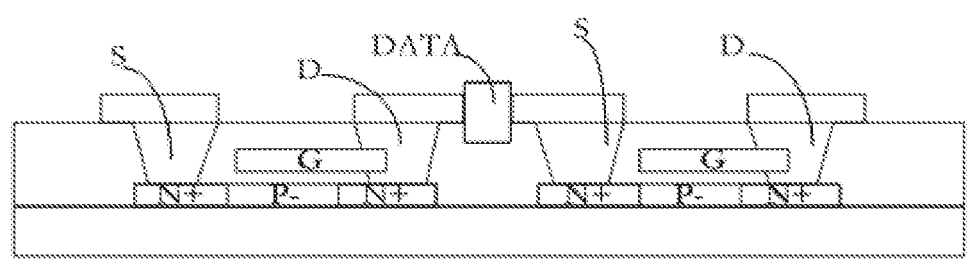
FIG. 2 shows a structure of the TFT LCD in FIG. 1.
Figure 3:
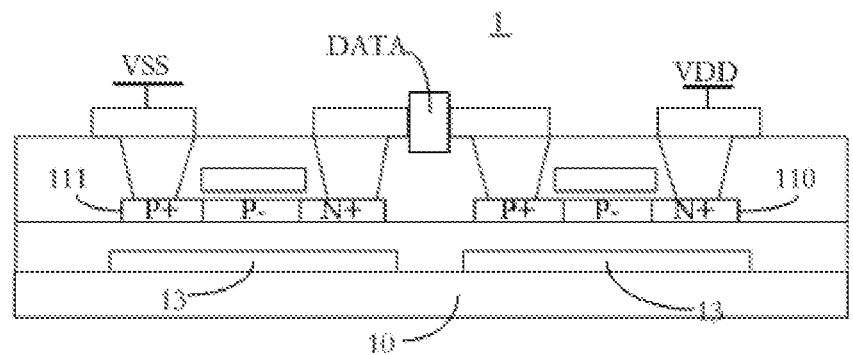
FIG. 3 is a schematic view of a structure of an array substrate according to an embodiment of the invention.
Figure 4:
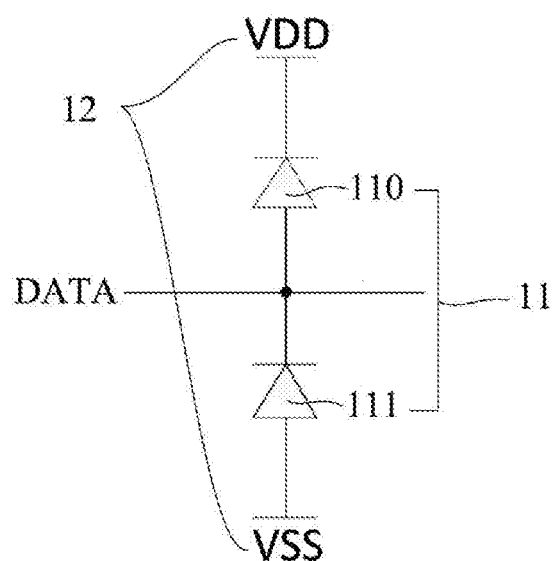
FIG. 4 shows a circuit diagram of the ESD circuit of the array substrate in FIG. 3.

Please referring to FIGS. 3 and 4, FIG. 3 is a schematic view of a structure of an array substrate according to an embodiment of the invention; and FIG. 4 shows a circuit diagram of the ESD circuit of the array substrate in FIG. 3. In the embodiment, an array substrate 1 includes a base substrate 10, and a data line DATA, a switching device and a voltage compensation module 12 arranged on the base substrate 10, the switching device is connected between the data line DATA and the voltage compensation module 12 so that the data line DATA is electrically connected to the voltage compensation module 12 when a voltage on the data line DATA is lower than a preset low voltage or higher than a preset high voltage; the switching device is constituted by at least one PN junction 11. In particular, the preset high voltage may be a highest positive operating voltage VGH of the array substrate 1, i.e. a highest positive voltage allowed by the normal operation of the array substrate 1, and the preset low voltage may be a lowest negative operating voltage VGL of the array substrate 1, i.e. a lowest negative voltage allowed by the normal operation of the array substrate 1; of course, the preset high voltage may be set to be a voltage lower than the highest positive operating voltage VGH, and the preset low voltage may be set to be a voltage higher than the lowest negative operating voltage VGL.

In the embodiment, when static electricity is generated on the array substrate 1 so that the voltage on the data line DATA is higher than the preset high voltage or lower than the preset low voltage, the voltage compensation module 12 is electrically connected to the data line DATA by the electrical conduction of the PN junction, so as to make the voltage on the data line DATA not higher than the preset high voltage or not lower than the preset low voltage, or make the voltage on the data line DATA not higher than the preset high voltage and not lower than the preset low voltage, thus making the voltage on the data line DATA be or as much as possible be within the normal operating range, and preventing the array substrate 1 and a display panel and a display device employing the array substrate 1 from being damaged due to the electrostatic discharge. At the same time, compared to the prior art in which the two ends of the polysilicon are N-type highly doped, the leakage current between the P terminal and the N terminal of the PN junction is lower, and thus the array substrate 1, and the display panel and the display device employing the array substrate 1 have lower power consumption.

In particular, as shown in FIGS. 3 and 4, the voltage compensation module 12 includes a high voltage terminal VDD and a low voltage terminal VSS, the voltage on the high voltage terminal VDD is equal to the preset high voltage, and the voltage on the low voltage terminal VSS is equal to the preset low voltage. The at least one PN junction 11 includes a first PN junction 110 and a second PN junction 111, a P terminal of the first PN junction 110 is connected to the data line DATA, and an N terminal of the first PN junction 110 is connected to the high voltage terminal VDD so that the first PN junction 110 may be electrically conductive to make the data line DATA electrically connected to the high voltage terminal VDD when the voltage on the data line DATA is higher than the preset high voltage; a P terminal of the second PN junction 111 is connected to the low voltage terminal VSS and an N terminal of the second PN junction 111 is connected to the data line DATA so that the second PN junction 111 may be electrically conductive to make the data line DATA electrically connected to the low voltage terminal VSS when the voltage on the data line DATA is lower than the preset low voltage.

Figure 5:
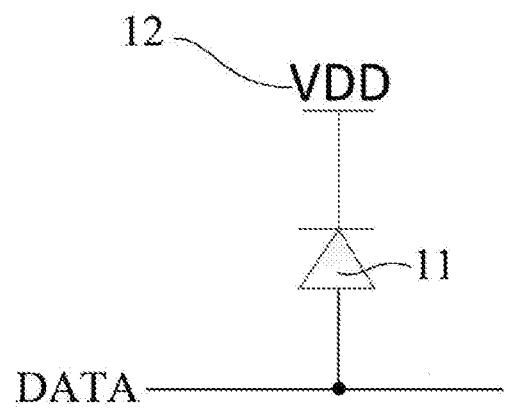
FIG. 5 shows a circuit diagram of a first alliterative of the ESD circuit in FIG. 4.

As an alternative, as shown in FIG. 5, the voltage compensation module 12 at least includes the high voltage terminal VDD (may include the low voltage terminal VSS, or may not include the low voltage terminal VSS); like the above embodiment, the voltage on the high voltage terminal VDD is also the preset high voltage; in this case, the switching device is constituted by one PN junction 11, a P terminal of the PN junction 11 is connected to the data line DATA, and an N terminal of the PN junction 11 is connected to the high voltage terminal VDD. In the embodiment, when the voltage on the data line DATA is higher than the preset high voltage, the PN junction 11 is electrically conductive so that the data line DATA is electrically connected to the high voltage terminal VDD.

Figure 6:
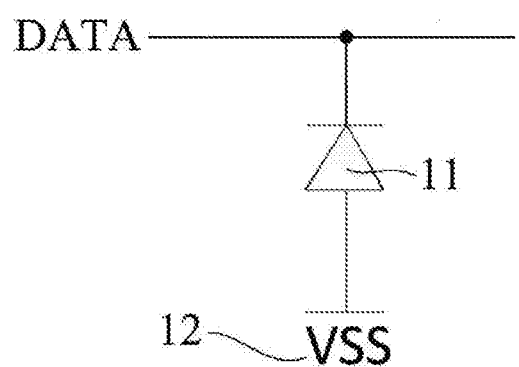
FIG. 6 shows a circuit diagram of a second alternative of the ESD circuit in FIG. 4.

As another alternative, as shown in FIG. 6, the voltage compensation module 12 at least includes the low voltage terminal VSS (may include the high voltage terminal VDD, or may not include the high voltage terminal VDD); like the above embodiment, the voltage on the low voltage terminal VSS is the preset low voltage; in this case, the switching device is constituted by one PN junction 11, a P terminal of the PN junction 11 is connected to the low voltage terminal VSS, and an N terminal of the PN junction 11 is connected to the data line DATA. In the embodiment, when the voltage on the data line DATA is lower than the preset low voltage, the PN junction 11 may be electrically conductive so that the data line DATA is electrically connected to the low voltage terminal VSS.

In particular, the P terminal (P+ region in FIG. 3) and the N terminal (N+ region in FIG. 3) of the PN junction 11 are formed by performing P-type highly doping and N-type highly doping at two ends of polysilicon or monocrystalline silicon, respectively. Further, there is an interval region (P− region in FIG. 3) between the P terminal and the N terminal of the PN junction 11, and P-type lightly doping is performed on the interval region.

Preferably, the array substrate 1 further includes a light blocking layer 13 formed on the base substrate 10, and the light blocking layer 13 is arranged directly below the at least one PN junction 11 (or the first PN junction 110 or the second PN junction 111), in other words, the at least one PN junction 11 (or the first PN junction 110 or the second PN junction 111) is arranged directly above the light blocking layer 13. Such an arrangement can prevent light emitted from a backlight source from being incident on the PN junction 11 to generate a leakage current between the P terminal and the N terminal of the PN junction 11.

The array substrate 11 includes an effective display region and a border region surrounding the effective display region, and generally the static electricity is generated in the border region, thus in the embodiment, the PN junction 11 and the voltage compensation module 12 are provided in the broader region.

Each pixel unit of the array substrate 1 is further provided with a thin film transistor therein, and the PN junction 11 is formed during the procedure of forming the thin film transistor; such an arrangement will not add further process for forming the array substrate 1, thus not increasing the production cost and the production time of the array substrate 1.

In view of the above, the array substrate 1 provided by the embodiment of the invention uses the PN junction 11 as the switching device connected between the data line DATA and the voltage compensation module 12, and compared to the prior art in which the gate and the drain of the thin film transistor are connected together, the leakage current between the P terminal and the N terminal of the PN junction 11 is lower, and thus the array substrate 1 provided by the embodiment of the invention has lower power consumption.

As another technical solution, an embodiment of the invention further provides a manufacturing method of an array substrate, for manufacturing the array substrate provided by the above embodiments of the invention, and the manufacturing method of the array substrate includes steps:

forming the data line on the base substrate; and forming at least one PN junction, which is connected to the data line and the voltage compensation module, on the base substrate.

The step of forming the at least one PN junction may include:

forming a polysilicon or monocrystalline silicon layer on the base substrate; and performing P-type highly doping and N-type highly doping on two ends of the polysilicon or monocrystalline silicon layer, respectively. In particular, P-type lightly doping may be performed on the region between the two ends of the polysilicon or monocrystalline silicon layer.

In the embodiment, the manufacturing method of the array substrate further includes a step of forming a thin film transistor on the base substrate; and the PN junction is formed during the step of forming the thin film transistor; thus it is not required to add a further process for forming the array substrate, and the production cost and the production time of the array substrate 1 will not be increased.

Preferably, the manufacturing method of the array substrate further includes a step of forming a light blocking layer on the base substrate prior to the step of forming the at least one PN junction; and the PN junction is arranged directly above the light blocking layer, such an arrangement can prevent light emitted from a backlight source from being incident on the PN junction to generate a leakage current between the P terminal and the N terminal of the PN junction.

In the manufacturing method of the array substrate provided by the embodiment of the invention, the PN junction connected to the data line and the voltage compensation module is formed on the base substrate to act as the switching device, which will cause the leakage current to be lower, so that the array substrate manufactured by the manufacturing method of the array substrate provided by the embodiment of the invention has lower power consumption.

As another technical solution, the invention provides a display panel, and in the embodiment, the display panel includes an array substrate and an opposite substrate, and the array substrate is the array substrate provided by the above embodiment of the invention.

The display panel provided by the embodiment employs the array substrate provided by the above embodiment of the invention, and thus can reduce power consumption.

As another technical solution, the invention provides a display device, and in the embodiment, the display device includes a display panel, and the display panel employs the display panel provided by the above embodiment of the invention.

The display device provided by the embodiment employs the display panel provided by the above embodiment of the invention, and thus can reduce power consumption.

It should be understood that, the above embodiments are only exemplary embodiments employed to illustrate the principle of the invention, and the invention is not limited thereto. For ordinary persons skilled in the art, various variants and improvements can be made without departing from the spirit and substance of the invention, and these variants and improvements are also regarded as the protection scope of the invention.

The invention claimed is:

1. An array substrate, including a base substrate, and a data line, a switching device and a voltage compensation module arranged on the base substrate, wherein the switching device is connected between the data line and the voltage compensation module so that the data line is electrically connected to the voltage compensation module when a voltage on the data line is lower than a preset low voltage or higher than a preset high voltage; wherein the switching device is constituted by at least one PN junction; and
further including a light blocking layer formed on the base substrate, wherein the light blocking layer is arranged directly below the PN junction.

2. The array substrate of claim 1, wherein the voltage compensation module includes a high voltage terminal and a low voltage terminal, a voltage on the high voltage terminal is the preset high voltage, and a voltage on the low voltage terminal is the preset low voltage.

3. The array substrate of claim 2, wherein the switching device includes a first PN junction and a second PN junction, a P terminal of the first PN junction is connected to the data line, and an N terminal of the first PN junction is connected to the high voltage terminal; and a P terminal of the second PN junction is connected to the low voltage terminal, and an N terminal of the second PN junction is connected to the data line.

4. The array substrate of claim 1, wherein the voltage compensation module includes a high voltage terminal, and a voltage on the high voltage terminal is the preset high voltage; and the switching device is constituted by one PN junction, a P terminal of the PN junction is connected to the data line, and an N terminal of the PN junction is connected to the high voltage terminal.

5. The array substrate of claim 1, wherein the voltage compensation module includes a low voltage terminal, and a voltage on the low voltage terminal is the preset low voltage; and the switching device is constituted by one PN junction, a P terminal of the PN junction is connected to the low voltage terminal, and an N terminal of the PN junction is connected to the data line.

6. The array substrate of claim 1, wherein a P terminal and an N terminal of the PN junction are formed by performing P-type highly doping and N-type highly doping on two ends of polysilicon or monocrystalline silicon.

7. The array substrate of claim 6, wherein there is an interval region between the P terminal and the N terminal of the PN junction, and P-type lightly doping is performed on the interval region.

8. The array substrate of claim 1, further including an effective display region and a border region surrounding the effective display region, wherein the PN junction and the voltage compensation module are arranged in the border region.

9. The array substrate of claim 1, wherein each pixel unit of the array substrate is provided with a thin film transistor therein, and the PN junction is formed during the procedure of forming the thin film transistor.

10. A manufacturing method of the array substrate of claim 1, including steps:
forming the data line on the base substrate; and
forming at least one PN junction, which is connected to the data line and the voltage compensation module, on the base substrate.

11. The manufacturing method of the array substrate of claim 10, wherein the step of forming the at least one PN junction includes:
forming a polysilicon or monocrystalline silicon layer on the base substrate; and
performing P-type highly doping and N-type highly doping on two ends of the polysilicon or monocrystalline silicon layer, respectively.

12. The manufacturing method of the array substrate of claim 10, further including a step of forming a thin film transistor on the base substrate, wherein the PN junction is formed during the step of forming the thin film transistor.

13. The manufacturing method of the array substrate of claim 10, further including a step of forming the light blocking layer on the base substrate prior to the step of forming the at least one PN junction.

14. A display panel, including an arrays substrate and an opposite substrate, wherein the array substrate is the array substrate of claim 1.

15. A display device, including the display panel of claim 14.

16. The array substrate of claim 2, wherein a P terminal and an N terminal of the PN junction are formed by performing P-type highly doping and N-type highly doping on two ends of polysilicon or monocrystalline silicon.

17. The array substrate of claim 3, wherein a P terminal and an N terminal of the PN junction are formed by performing P-type highly doping and N-type highly doping on two ends of polysilicon or monocrystalline silicon.

18. The array substrate of claim 4, wherein a P terminal and an N terminal of the PN junction are formed by performing P-type highly doping and N-type highly doping on two ends of polysilicon or monocrystalline silicon.

* * * * *